United States Patent
Döllgast et al.

(10) Patent No.: US 8,704,430 B2
(45) Date of Patent: Apr. 22, 2014

(54) PIEZOCERAMIC MULTILAYER ACTUATOR WITH HIGH RELIABILITY

(75) Inventors: Bernhard Döllgast, Deutschlandsberg (AT); Masahiro Inagaki, Kagoshima (JP); Harald Johannes Kastl, Fichtelberg (DE); Atsushi Ochi, Yokohama (JP); Takami Sakamoto, Kagoshima (JP); Carsten Schuh, Baldham (DE)

(73) Assignees: Continental Automotive GmbH, Hannover (DE); Kyocera Corporation, Kyoto (JP)

( * ) Notice: Subject to any disclaimer, the term of this patent is extended or adjusted under 35 U.S.C. 154(b) by 630 days.

(21) Appl. No.: 12/376,346

(22) PCT Filed: Aug. 6, 2007

(86) PCT No.: PCT/EP2007/058131
§ 371 (c)(1),
(2), (4) Date: Apr. 19, 2010

(87) PCT Pub. No.: WO2008/017655
PCT Pub. Date: Feb. 14, 2008

(65) Prior Publication Data
US 2010/0194247 A1      Aug. 5, 2010

(30) Foreign Application Priority Data
Aug. 9, 2006 (EP) .................................... 06016633

(51) Int. Cl.
*H01L 41/083* (2006.01)
(52) U.S. Cl.
USPC .......................................... 310/366; 310/328
(58) Field of Classification Search
USPC ................... 310/328, 363–369, 311
IPC ............................................. H01L 41/08, 41/083
See application file for complete search history.

(56) References Cited

U.S. PATENT DOCUMENTS 5,089,739 A * 2/1992 Takahashi et al. ............ 310/328
7,358,655 B2 4/2008 Ragossnig et al.
(Continued)

FOREIGN PATENT DOCUMENTS

DE 10254450 7/2003 ............... F02M 1/00
DE 10254450 A1 7/2003
(Continued)

OTHER PUBLICATIONS

International Search Report and Written Opinion; PCT/EP2007/058131; pp. 10, Dec. 6, 2007.
(Continued)

*Primary Examiner* — Thomas Dougherty
*Assistant Examiner* — Karen B Addison
(74) *Attorney, Agent, or Firm* — King & Spalding L.L.P.

(57) ABSTRACT

A piezoceramic multilayer actuator has a first sub-stack (12, 14, 16) with a plurality of piezoceramic layers (22) and at least one internal electrode (24, 26), the piezoceramic layers (22) and the at least one internal electrode (24, 26) being laminated in an alternating manner, a second sub-stack (12, 14, 16) has a plurality of piezoceramic layers (22) and at least one internal electrode (24, 26), the piezoceramic layers (22) and the at least one internal electrode (24, 26) being laminated in an alternating manner, and a connection layer (40) arranged between the first sub-stack (12, 14, 16) and the second sub-stack (12, 14, 16), wherein the connection layer (40) is set up by a multitude of single connection points or connection lines (44) or other connection regions.

18 Claims, 2 Drawing Sheets

(56) References Cited

U.S. PATENT DOCUMENTS

| | | |
|---|---|---|
| 7,420,319 B2 | 9/2008 | Kastl et al. |
| 7,498,926 B2 * | 3/2009 | Browne et al. .............. 340/425.5 |
| 2004/0178701 A1 * | 9/2004 | Sato et al. ..................... 310/328 |
| 2006/0043841 A1 * | 3/2006 | Kadotani et al. .............. 310/328 |
| 2006/0181178 A1 | 8/2006 | Kastl et al. |
| 2006/0238073 A1 * | 10/2006 | Ragossnig et al. ............ 310/328 |
| 2009/0278422 A1 * | 11/2009 | Florian et al. ................. 310/326 |

FOREIGN PATENT DOCUMENTS

| | | | |
|---|---|---|---|
| DE | 10234787 C1 | 10/2003 | |
| DE | 10307825 A1 | 9/2004 | |
| DE | 102004031402 A1 | 2/2006 | |
| DE | 102004050803 | 4/2006 | |
| DE | 102004050803 A1 | 4/2006 | ............ H01L 41/083 |
| EP | 0479328 A2 | 4/1992 | |
| JP | 292956 | 7/1990 | ............. H01L 41/08 |
| JP | 2003-224313 * | 8/2003 | ............ H01L 41/083 |
| JP | 2003224313 A | 8/2003 | ............ F02M 51/00 |

OTHER PUBLICATIONS

Japanese Office Action, Application No. 2009-523269, 7 pages, Nov. 9, 2012.

* cited by examiner

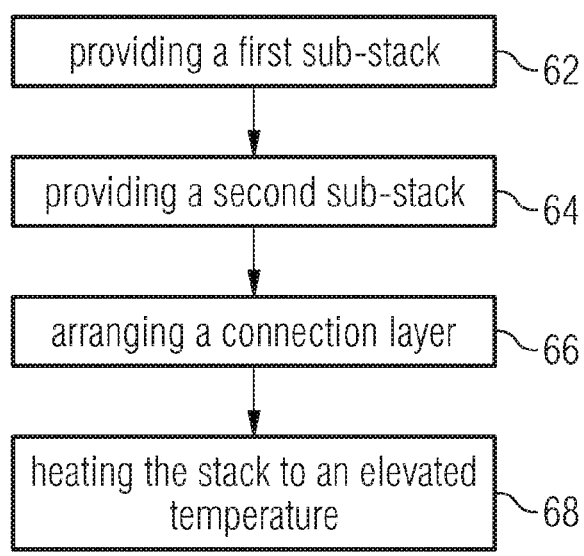

PIEZOCERAMIC MULTILAYER ACTUATOR WITH HIGH RELIABILITY

CROSS-REFERENCE TO RELATED APPLICATIONS

This application is a U.S. National Stage Application of International Application No. PCT/EP2007/058131 filed Aug. 6, 2007, which designates the United States of America, and claims priority to EP Patent Application No. 06016633.7 filed Aug. 9, 2006, the contents of which are hereby incorporated by reference in their entirety.

TECHNICAL FIELD

The present invention refers to a piezoceramic multilayer actuator comprising a stack of a plurality of piezoceramic layers and at least one internal electrode arranged between the piezoceramic layers. The present invention addresses the problem of mechanical stress inside the piezoceramic multilayer actuator and the cracks resulting from this stress.

BACKGROUND

Piezoceramic actuators are used and optimized for a large number of applications in virtually all fields of technology. The application of an electrical field to the piezoceramic actuator results in a geometrical distortion, particularly in a change of length and height. In order to reduce the voltage to be applied to the actuator and/or increase its distortion, piezoceramic actuators usually comprise a large number of thin piezoceramic layers and internal electrodes arranged alternatingly in a stack.

During manufacturing, the piezoceramic layers are provided as green sheets and laminated with the internal electrodes to form a stack. The stack is burned or heated to a sintering temperature of the piezoceramic layers thereby transferring the sheets from the green state to the ceramic state. External electrodes are deposited on or arranged at lateral surfaces of the stack and connected to the internal electrodes in an electrically conductive way. Each internal electrode is connected to only one of the (at least) two external electrodes. This is achieved by providing the internal electrodes in such a way that the edge of an internal electrode which is to be connected to an external electrode on the lateral surface is flush with this lateral surface while there is provided a distance between the edge of an internal electrode and a lateral surface if the internal electrode is to be electrically insulated from an external electrode on this lateral surface.

Particularly due to temperature gradients during the cooling phase after the sintering process and due to lateral inhomogeneities within the piezoceramic layers (e.g. microstructural differences), mechanical stress within the stack arises.

After baking the stack of piezoceramic layers, a high electrical field is applied to the piezoceramic layers by applying a corresponding electrical voltage to the internal electrodes via the external electrodes. The value of the electrical field is selected such that a permanent electrical polarization and a permanent distortion of the piezoceramic layers remains after switching off the electrical field. This procedure is called poling.

Since the internal electrodes do not extend to all lateral surfaces of the stack, the piezoceramic layers are not exposed to a laterally homogeneous electrical field and are not polarized and distorted in a laterally homogeneous way. Rather, close to the lateral surfaces, mechanical stress inside the piezoceramic layers results. This mechanical stress is further increased during operation of the piezoceramic actuator. Cracks occur in the stack both inside the piezoceramic layers and along the internal electrodes and frequently cause a failure of the piezoceramic actuator.

According to EP 0 479 328 A2, slits in a piezoelectric actuator reduce tensile stress.

According to DE 103 07 825 A1, a ceramic rupture layer is arranged between two ceramic layers of a piezoceramic multilayer actuator, the ceramic rupture layer forming a predetermined breaking layer.

According to DE 102 34 787 C1, microdisturbances are incorporated in the piezoceramic layers of an actuator in such a manner that these act as crack sources located quasi at a pre-known site, with the crack growth being controllable.

According to DE 10 2004 031 402 A1, a piezoelectric device comprises a predetermined breaking point in an internal electrode.

SUMMARY

According to various embodiments, a piezoceramic multilayer actuator and a method for manufacturing a piezoceramic multilayer actuator can be provided with improved reliability and reduced risk of failure.

According to an embodiment, a piezoceramic multilayer actuator may comprise a first sub-stack comprising a plurality of piezoceramic layers and at least one internal electrode, the piezoceramic layers and the at least one internal electrode being laminated in an alternating manner; a second sub-stack comprising a plurality of piezoceramic layers and at least one internal electrode, the piezoceramic layers and the at least one internal electrode being laminated in an alternating manner; and a connection layer arranged between the first sub-stack and the second sub-stack, wherein the connection layer is set up by a multitude of connection regions between the first and second sub-stacks, which regions are isolated from each other.

According to a further embodiment, the connection layer may be set up by a multitude of single connection points or connection lines between the first and second sub-stacks. According to a further embodiment, the connection layer can be metallic. According to a further embodiment, the piezoceramic multilayer actuator may further comprise a functional layer at the interface between the first or second sub-stack and the connection layer, the functional layer providing a predefined wettability with respect to the material of the connection layer. According to a further embodiment, the surface tension of the material of the connection layer may be higher than the surface tension of an internal electrode material. According to a further embodiment, the wettability of the material of the connection layer to a connection surface of one of the sub-stacks may be lower than the wettability of an internal electrode material to an adjacent piezoceramic layer of one of the sub-stacks. According to a further embodiment, the height of each of the sub-stacks may be in the range of 1 mm to 3 mm. According to a further embodiment, the height of the connection layer may be in the range of 0.1 µm to 5 µm.

According to another further embodiment, a method of manufacturing a piezoceramic multilayer actuator, may comprise the steps of: providing a first sub-stack comprising a plurality of piezoceramic layers and at least one internal electrode, the piezoceramic layers and the at least one internal electrode being laminated in an alternating manner; providing a second sub-stack comprising a plurality of piezoceramic layers and at least one internal electrode, the piezoceramic layers and the at least one internal electrode being laminated in an alternating manner; and arranging a connection layer set up by a multitude of connection regions between the first and second sub-stacks to form a stack, wherein the regions are isolated from each other.

According to a further embodiment, the connection layer may be set up by a multitude of single connection points or lines between the first and second sub-stacks to form a stack. According to a further embodiment, at least one of the sub-stacks may be dewaxed or sintered before the connection layer is arranged between the sub-stacks. According to a further embodiment, arranging may comprise laminating the sub-stacks and the connection layer. According to a further embodiment, arranging the connection layer may comprise: depositing a material with at least one of high surface tension and poor wettability to at least one of a connection surface of the first sub-stack and to a connection surface of the second sub-stack. According to a further embodiment, the method may further comprise: depositing a functional layer on the connection surface before arranging the connection layer, the functional layer providing a predefined wettability with respect to the material of the connection layer. According to a further embodiment, the step of arranging the connection layer may comprise: depositing a laterally homogeneous layer of connection layer material to at least one of a connection surface of the first sub-stack and to a connection surface of the second sub-stack heating the stack to an elevated temperature at which the laterally homogeneous layer transforms to the connection layer set up by the multitude of single connection points or lines.

BRIEF DESCRIPTION OF THE DRAWINGS

The various embodiments will become clear from the following description taken in conjunction with the accompanying drawings in which:

FIG. 3 is a schematic flow chart of a method for manufacturing a piezoceramic multilayer actuator.

DETAILED DESCRIPTION

Figure 1:
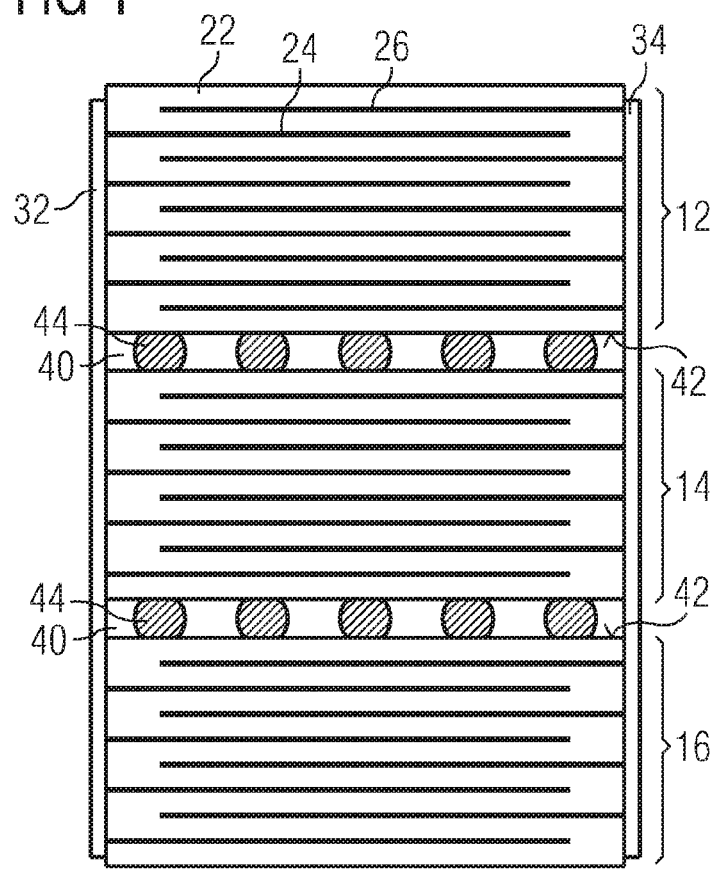
FIG. 1 is a schematic view of a vertical cross section of a piezoceramic multilayer actuator.

According to various embodiments, a piezoceramic multilayer actuator is provided comprising a first sub-stack comprising a plurality of piezoceramic layers and at least one internal electrode, the piezoceramic layers and the at least one internal electrode being laminated in an alternating manner, a second sub-stack comprising a plurality of piezoceramic layers and at least one internal electrode, the piezoceramic layers and the at least one internal electrode being laminated in an alternating manner, and a connection layer arranged between the first sub-stack and the second sub-stack, wherein the connection layer is set up by a multitude of single connection points or lines or other regions which are isolated, or separated, or disconnected, from each other.

Further, according to another embodiment, a method for manufacturing a piezoceramic multilayer actuator, comprising:
providing a first sub-stack comprising a plurality of piezoceramic layers and at least one internal electrode, the piezoceramic layers and the at least one internal electrode being laminated in an alternating manner;
providing a second sub-stack comprising a plurality of piezoceramic layers and at least one internal electrode, the piezoceramic layers and the at least one internal electrode being laminated in an alternating manner; and
arranging a connection layer set up by a multitude of single connection points or lines or by a multitude of other regions between the first sub-stack and the second sub-stack to form a stack, wherein the points or lines or regions are isolated, or separated or disconnected, from each other.

According to various embodiments, cracks are localized in a piezoceramic multilayer actuator in connection layers separating a plurality of sub-stacks from each other, the connection layers being set up by a multitude of single connection regions being isolated from each other. Mechanical stress is therefore concentrated at edges and in particular at convex features of these regions. The concentration of mechanical stress results in an increased probability that cracks form and propagate within the connection layer. Thus, the probability of forming cracks outside the connection layer is reduced.

It is particularly advantageous to provide a connection layer set up by a multitude of single connection points or connection lines connecting the adjacent sub-stacks because points (i.e. small islands) or lines provide a particularly large number of convex features with particularly small radii. The smaller the convex radii of the single regions forming the connection layer, the stronger is the concentration of mechanical stress and the better is the above-outlined localisation of cracks within the connection layer.

These properties of a connection layer are achieved by selecting an appropriate connection layer material with a high surface tension which is in particular higher or much higher than the surface tension of an internal electrode material provided inside the sub-stacks. A related but not identical parameter is the wettability of the material of the connection layer to a connection surface of at least one of the sub-stacks. If this wettability is poor, in particular lower than the wettability of the internal electrode material to the adjacent piezoceramic layers, there is a tendency to form single connection points or connection lines instead of a homogeneous connection layer.

These single connection points or connection lines or other connection regions cause a reduced cohesion between the sub-stacks. Each sub-stack is preferably between 1 mm and 3 mm high. Since the mechanical stress of the single piezoceramic layers accumulates, the mechanical stress in a stack or a sub-stack increases with its height. The mechanical stress within a sub-stack of only a few millimeters thickness is rather low and causes a comparatively low risk of cracks. The connection layer and the resulting weak cohesion between the sub-stacks prevent the accumulation of the mechanical stress of several sub-stacks. Instead, any mechanical stress between the sub-stacks causes a crack within the connection layer. In this way the connection layer is a predetermined breaking point.

A metallic connection layer is particularly advantageous. Metal and metal alloys are perfectly compatible to the processes used for manufacturing a piezoceramic multilayer actuator. In particular, a metallic connection layer can be laminated between green sub-stacks, the whole stack being burned afterwards.

Preferably the connection layer is metallic, i.e. the connection layer consists of metal or a metal alloy. Silver and silver alloys comprising copper, palladium, platinum, nickel or other metals are particularly advantageous.

The sub-stacks may be originally provided in a green state, the complete stack formed by a plurality of sub-stacks and connection layers in between being burned afterwards. As an alternative, the sub-stacks are already sintered before they are laminated with the connection layers in between.

FIG. 1 is a schematic view of a cross section of a piezoceramic multilayer actuator wherein the cross section is vertical or normal to the single layers forming the actuator and parallel to the direction of lamination. The piezoceramic multilayer actuator comprises sub-stacks 12, 14, 16. Each sub-stack 12, 14, 16 comprises a plurality of piezoceramic layers 22 and internal electrodes 24, 26 which are laminated in an alternating manner. Every second internal electrode 24 is electrically connected to a first external electrode 32 and electrically insulated from a second external electrode 34. The other internal electrodes 26 are electrically insulated from the first external electrode 32 and electrically connected to the second external electrode 34.

Connection layers 40 are arranged between the sub-stacks 12, 14, 16. Each connection layer 40 comprises a metal, an alloy, ceramics, CMC (Ceramic Matrix Composite) or MMC (Metal Matrix Composite) with a very high surface tension or sinterability and/or exhibits a poor wettability to the connection surfaces 42 of the sub-stacks 12, 14, 16. Therefore, each connection layer consists of a plurality of single connection points or lines 44.

This structure of the connection layer causes a weak cohesion between the sub-stacks 12, 14, 16. In particular the cohesive strength of the connection layers 44 is smaller than the cohesive strength of the piezoceramic layers 22 and the internal electrodes 24, 26 inside the sub-stack 12, 14, 16. Therefore, any mechanical stress between the sub-stacks 12, 14, 16 will not accumulate but easily result in a crack inside the connection layers 44. Thereby the sub-stacks 12, 14, 16 with their delicate structure of very thin piezoceramic layers 22 and internal electrodes 24, 26 are largely protected from cracks which could otherwise easily cause a failure of the entire piezoceramic multilayer actuator.

Figure 2:
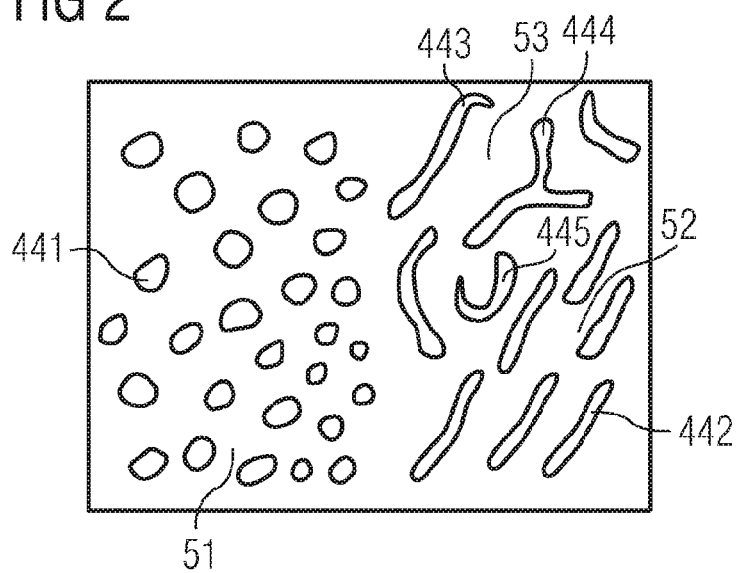
FIG. 2 is a schematic view of a horizontal cross section of a connection layer.

FIG. 2 is a schematic view of a horizontal cross section of the piezoceramic multilayer actuator described above with reference to FIG. 1. The cross section displayed in FIG. 2 is within the connection layer 40. FIG. 2 displays in an exemplifying way several types of connection points or lines in several regions although a connection layer preferably consists of only one type of connection points or lines.

In a first region 51 the connection layer consists of connection points 441 which in this cross section are preferably essentially circular and of equal size. In a second region 52, the connection layer 40 consists of a plurality of connection lines 442 of essentially equal length, width and orientation. In a third region 53, the connection layer 40 consists of a plurality of connection lines 443, 444, 445 with a wide variety of shapes. There are essentially straight connection lines 443, bent connection lines 445 and connection lines 444 with one or more bifurcations.

The preferred height of the connection layer 40 is between about 0.1 μm and 5 μm. Preferably the connection layer 40 is an electrical insulator, or provides a high electrical resistance. The size, shape and number of the connection points or lines 44, 441, 442, 443, 444, 445 and the mechanical properties of the connection layer material are set such that an appropriate stiffness of the whole stack is secured. A preferred distance between single connection points or lines is about 300 μm.

The shape and size of the connection points or lines 44, 441, 442, 443, 444, 445 are largely predetermined by the properties of the connection layer material and of the adjacent connection surfaces 42 of the sub-stacks 12, 14, 16. In particular, the size, shape and orientation of the single connection points and lines 44 etc. depend on the surface tension of the connection layer material, on the interface tension, or specific energy, of the interface between the connection layer material and the connection surfaces 42 of the sub-stacks 12, 14, 16, and on a preceding treatment of the connection surfaces 42. Therefore, by manipulating these parameters, the size, shape and orientation of the connection points or lines 44 etc. can be easily set to desired values. For example, the specific energy of the interface between the connection layer material and a connection surface 42 can be modified by means of a coating on the connection surface 42. An example for a treatment of the connection surface 42 is a mechanical brushing producing small grooves which predetermine the orientation of connection lines.

FIG. 3 is a schematic flow chart of a method for manufacturing a piezoceramic multilayer actuator. In a first step 62, a first sub-stack 12, 14, 16 comprising a plurality of piezoceramic layers 22 and at least one internal electrode 24, 26 is provided. The piezoceramic layers 22 and the at least one internal electrode 24, 26 are laminated in an alternating manner. Preferably, the first sub-stack 12, 14, 16 is provided in a green state. As an alternative, the first sub-stack 12, 14, 16 is laminated from green sheets and the internal electrode 24, 26 material and then baked, or heated to an elevated temperature in order to provide a dewaxed or sintered sub-stack 12, 14, 16.

In a second step 64 a second sub-stack 12, 14, 16 is provided. A second sub-stack 12, 14, 16 preferably provides the same properties, in particular the same materials and the same geometry as the first sub-stack 12, 14, 16. As an alternative, the second sub-stack provides a different geometry, particularly a different height, and/or piezoceramic layers 22 with different thickness or material.

In a third step 66, a connection layer is arranged between the first and second sub-stacks 12, 14, 16. Preferably the sub-stacks 12, 14, 16 are piled up with intermediate connection layers 40 between the consecutive sub-stacks 12, 14, 16. After the stacking procedure a lamination step can be executed. Depending on the kind of sub-stacks 12, 14, 16, further processes like dicing or a thermal treatment are performed subsequently.

The connection layers 40 can be provided as separate foils or films. Alternatively, the connection layers 40 are applied to connection surfaces 42 of the sub-stacks 12, 14, 16 by means of physical or chemical deposition processes, e.g. PVD, CVD, spin-coating, spray coating, a sol-gel-process, a cold spray process, printing, dipping, etc. The connection layer can be applied as an inorganic-organic composite material whereafter the organic phase is eliminated by physical or chemical dissolution or decomposition or by a heat treatment.

In order to set the wettability of the connection layer material to the connection surface 42, the latter can be formed by a functional layer with predetermined properties which is deposited on the sub-stack 12, 14, 16.

In a fourth step 68, the stack comprising the sub-stacks 12, 14, 16 and the connection layers 40 is heated to an elevated temperature at which the originally homogeneous film like connection layer 40 is transformed into a plurality of single connection points or lines as described above with reference to FIG. 2. As an alternative, these single connection points or lines are already formed during a deposition of the connection layer material on the connection surface 42.

During the step of heating 68 the stack to an elevated temperature one or more components of or chemical elements comprised in the connection layer material may diffuse into the sub-stacks 12, 14, 16 thereby altering the properties of the connection layer material. Advantage can be taken of this diffusion, or the diffusion can be reduced by an appropriate functional layer at the connection surface 42 of the sub-stacks 12, 14, 16.

What is claimed is:

1. Piezoceramic multilayer actuator comprising:
   a first sub-stack comprising a plurality of piezoceramic layers and at least one internal electrode, the piezoceramic layers and the at least one internal electrode being laminated in an alternating manner;

a second sub-stack comprising a plurality of piezoceramic layers and at least one internal electrode, the piezoceramic layers and the at least one internal electrode being laminated in an alternating manner; and a connection layer arranged between the first sub-stack and the second sub-stack, wherein the connection layer defines a predetermined breaking point and includes a multitude of connection regions between the first and second sub-stacks, which regions are isolated from each other.

2. Piezoceramic multilayer actuator according to claim 1, wherein the connection layer is set up by a multitude of single connection points or connection lines between the first and second sub-stacks.

3. Piezoceramic multilayer actuator according to claim 1, wherein the connection layer is metallic.

4. Piezoceramic multilayer actuator according to claim 1, wherein the interface between the first or second sub-stack and the connection layer is treated such that a surface of the first and second substack provides a predefined wettability with respect to the material of the connection layer.

5. Piezoceramic multilayer actuator according to claim 1, wherein the surface tension of the material of the connection layer is higher than the surface tension of an internal electrode material.

6. Piezoceramic multilayer actuator according to claim 1, wherein the wettability of the material of the connection layer to a connection surface of one of the sub-stacks is lower than the wettability of an internal electrode material to an adjacent piezoceramic layer of one of the sub-stacks.

7. Piezoceramic multilayer actuator according to claim 1, wherein the height of each of the sub-stacks is in the range of 1 mm to 3 mm.

8. Piezoceramic multilayer actuator according to claim 1, wherein the height of the connection layer is in the range of 0.1 μm to 5 μm.

9. Piezoceramic multilayer actuator comprising:

a first sub-stack comprising a plurality of piezoceramic layers and at least one internal electrode, the piezoceramic layers and the at least one internal electrode being laminated in an alternating manner;

a second sub-stack comprising a plurality of piezoceramic layers and at least one internal electrode, the piezoceramic layers and the at least one internal electrode being laminated in an alternating manner; and a connection layer arranged between the first sub-stack and the second sub-stack, wherein the connection layer defines a predetermined breaking point and consists of a multitude of connection regions between the first and second sub-stacks, which regions are isolated from each other.

10. Piezoceramic multilayer actuator according to claim 9, wherein the connection layer includes a multitude of single connection points or connection lines between the first and second sub-stacks.

11. Piezoceramic multilayer actuator according to claim 10, wherein the connection layer is metallic.

12. Piezoceramic multilayer actuator according to claim 10, wherein a surface of a first and/or second sub-stack facing the connection layer is treated such that the surface provides a predefined wettability with respect to the material of the connection layer.

13. Piezoceramic multilayer actuator according to claim 12, wherein the surface is mechanically brushed producing small grooves.

14. Piezoceramic multilayer actuator according to claim 12, wherein the surface is coated to set a desired wettability.

15. Piezoceramic multilayer actuator according to claim 10, wherein the surface tension of the material of the connection layer is higher than the surface tension of an internal electrode material.

16. Piezoceramic multilayer actuator according to claim 10, wherein the wettability of the material of the connection layer to a connection surface of one of the sub-stacks is lower than the wettability of an internal electrode material to an adjacent piezoceramic layer of one of the sub-stacks.

17. Piezoceramic multilayer actuator according to claim 10, wherein the height of each of the sub-stacks is in the range of 1 mm to 3 mm.

18. Piezoceramic multilayer actuator according to claim 10, wherein the height of the connection layer is in the range of 0.1 μm to 5 μm.

* * * * *